United States Patent
Lu et al.

(10) Patent No.: US 9,882,013 B2
(45) Date of Patent: Jan. 30, 2018

(54) SEMICONDUCTOR DEVICE AND MANUFACTURING METHOD THEREOF

(71) Applicant: Taiwan Semiconductor Manufacturing Co., Ltd., Hsinchu (TW)

(72) Inventors: Jung-Wang Lu, Taipei (TW); Kuo Hui Chang, Taoyuan (TW); Mu-Tsang Lin, Changhua County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/086,072

(22) Filed: Mar. 31, 2016

(65) Prior Publication Data

US 2017/0288032 A1    Oct. 5, 2017

(51) Int. Cl.
*H01L 21/28* (2006.01)
*H01L 29/423* (2006.01)
*H01L 29/66* (2006.01)
*H01L 21/311* (2006.01)
*H01L 29/78* (2006.01)
*H01L 21/3205* (2006.01)
*H01L 29/49* (2006.01)
*H01L 21/8234* (2006.01)

(52) U.S. Cl.
CPC .... *H01L 29/4232* (2013.01); *H01L 21/31111* (2013.01); *H01L 21/32051* (2013.01); *H01L 29/4975* (2013.01); *H01L 29/6653* (2013.01); *H01L 29/66545* (2013.01); *H01L 29/78* (2013.01); *H01L 21/28114* (2013.01); *H01L 21/823456* (2013.01)

(58) Field of Classification Search
CPC ............... H01L 21/28114; H01L 21/823456
USPC .................................................... 257/288
See application file for complete search history.

(56) References Cited

U.S. PATENT DOCUMENTS

| | | | |
|---|---|---|---|
| 9,190,272 B1 * | 11/2015 | Park ................ | H01L 21/28114 |
| 2007/0126067 A1 * | 6/2007 | Hattendorf ........ | H01L 21/26586 |
| | | | 257/412 |
| 2009/0309159 A1 * | 12/2009 | Morita .............. | H01L 21/82381 |
| | | | 257/347 |
| 2012/0052647 A1 * | 3/2012 | Kim ................. | H01L 21/28114 |
| | | | 438/300 |
| 2012/0135594 A1 * | 5/2012 | Hong ................ | H01L 21/28079 |
| | | | 438/591 |
| 2014/0042553 A1 * | 2/2014 | Chiang ............ | H01L 21/28114 |
| | | | 257/401 |
| 2015/0069535 A1 * | 3/2015 | Chang .............. | H01L 29/42376 |
| | | | 257/411 |
| 2015/0115363 A1 * | 4/2015 | Chang .............. | H01L 21/82343 |
| | | | 257/347 |
| 2015/0171216 A1 * | 6/2015 | Xie .................. | H01L 21/0217 |
| | | | 257/401 |
| 2015/0236159 A1 * | 8/2015 | He ................... | H01L 29/66795 |
| | | | 257/401 |

(Continued)

*Primary Examiner* — George Fourson, III
(74) *Attorney, Agent, or Firm* — JCIPRNET

(57) ABSTRACT

Provided is a semiconductor device including a gate electrode, source and drain regions, and a spacer. The gate electrode is located over a substrate, and an angle of a base corner of the gate electrode is greater than 90 degrees. The source and drain regions are located in the substrate at sides of the gate electrode. The spacer is located at a sidewall of the gate electrode.

19 Claims, 5 Drawing Sheets

(56) References Cited

U.S. PATENT DOCUMENTS

| | | | |
|---|---|---|---|
| 2016/0056292 A1* | 2/2016 | Ho | H01L 29/7851 |
| | | | 257/401 |
| 2016/0099324 A1* | 4/2016 | Chang | H01L 21/28114 |
| | | | 257/401 |
| 2016/0099337 A1* | 4/2016 | Cheng | H01L 29/66545 |
| | | | 438/585 |

* cited by examiner

SEMICONDUCTOR DEVICE AND MANUFACTURING METHOD THEREOF

BACKGROUND

The semiconductor integrated circuit (IC) industry has experienced rapid growth. Over the course of this growth, functional density of the devices has generally increased by the device feature size.

This scaling down process generally provides benefits by increasing production efficiency, lower costs, and/or improving performance. Such scaling down has also increased the complexities of processing and manufacturing ICs and, for these advances to be realized, similar developments in IC fabrication are needed.

As technology nodes shrink, in some IC designs, the typical polysilicon gate electrode is replaced with a metal gate electrode to improve device performance with the decreased feature sizes. However, there are still quite a few challenges to be handled for the technology of the metal gate electrode.

DETAILED DESCRIPTION

Figure 1:
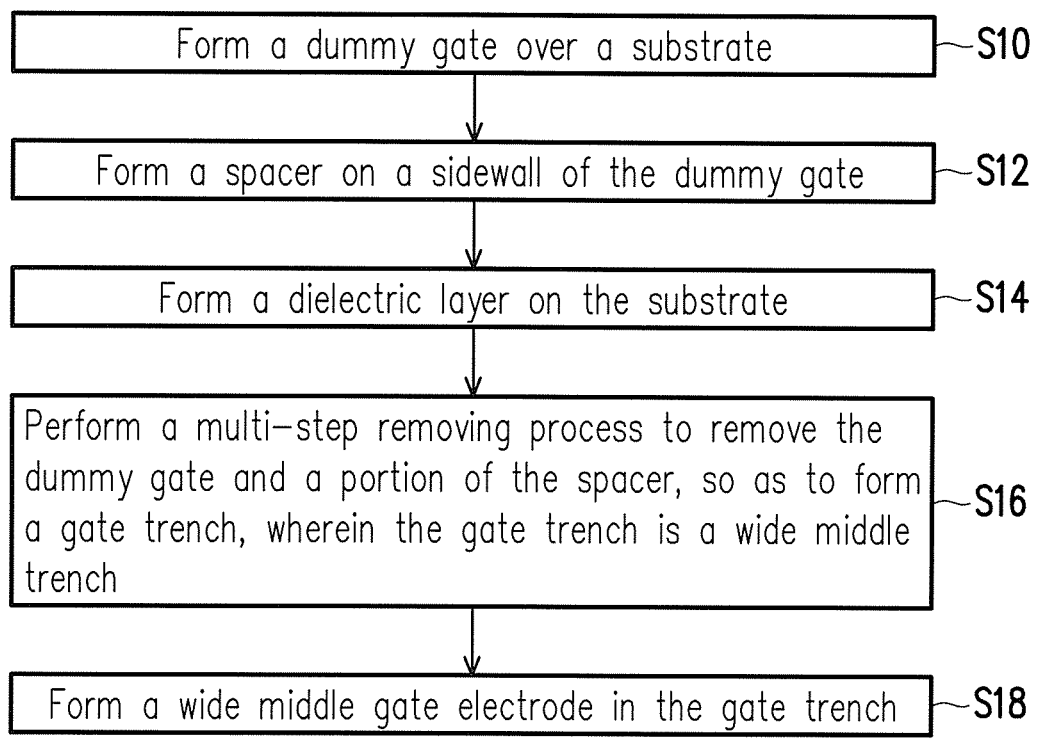
FIG. 1 is a flowchart illustrating a manufacturing method of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart illustrating a manufacturing method of a semiconductor device according to some embodiments of the disclosure. FIG. 3A through FIG. 3G are schematic cross-sectional views illustrating a manufacturing method of a semiconductor device in accordance with some embodiments of the disclosure.

Figure 3A:
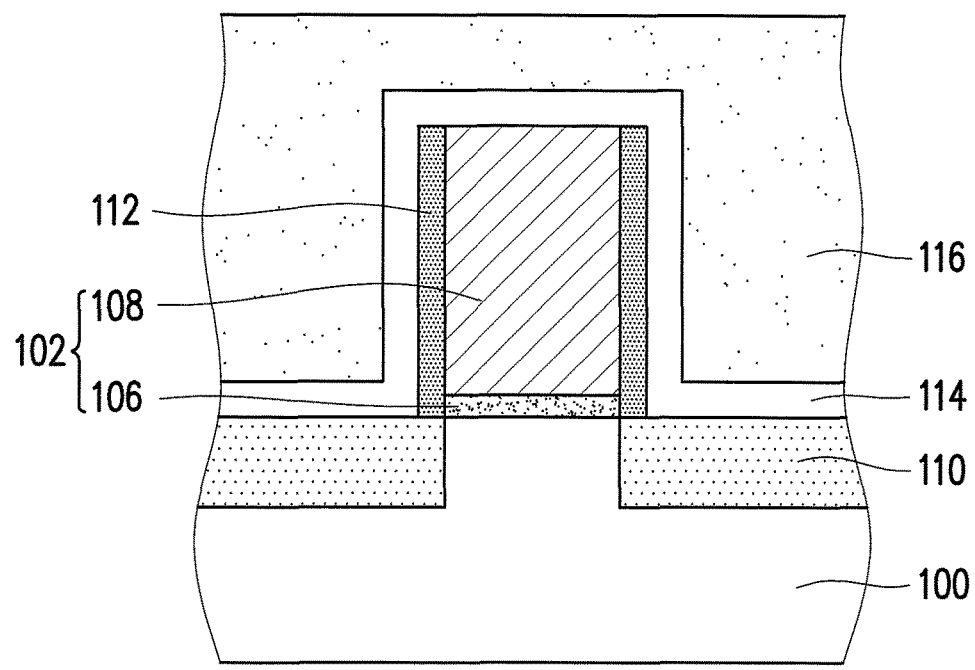
FIG. 3A through FIG. 3F are schematic cross-sectional views illustrating a manufacturing method of a semiconductor device in accordance with some embodiments of the disclosure.

Referring to FIG. 1 and FIG. 3A simultaneously, in step S10, a substrate 100 is provided. The substrate 100 is a bulk semiconductor substrate or a fin of a semiconductor substrate, for example. In some embodiments, the substrate 100 is made of silicon or other semiconductor materials. Alternatively or additionally, the substrate 100 includes other elementary semiconductor materials such as germanium, gallium, arsenic, or other suitable semiconductor materials. In some embodiments, the substrate 100 may further include other features such as various doped regions, a buried layer, and/or an epitaxy layer. Moreover, in some embodiments, the substrate 100 is made of an alloy semiconductor such as silicon germanium, silicon germanium carbide, gallium arsenic phosphide, or gallium indium phosphide. Furthermore, the substrate 100 may be a semiconductor on insulator such as silicon on insulator (SOI) or silicon on sapphire.

Then, a dummy gate structure 102 is formed over the substrate 100. In some embodiments, the dummy gate structure 102 includes a gate dielectric layer 106 and a dummy gate 108 in a sequential order from bottom to top. The method of forming the dummy gate structure 102 includes forming a gate dielectric material layer (not shown) over the substrate 100 and a dummy layer (not shown) over the gate dielectric material layer, and then patterning the dummy layer and the gate dielectric layer with photolithography and etching processes. In some embodiments, the gate dielectric material layer includes silicon oxide, silicon oxyntirde, a dielectric material having a dielectric constant greater than 7 (referred to as "a high-k material" throughout the description), or a combination thereof. In some embodiments, the high-k material includes metal oxide such as HfO, LaO, AlO, ZrO, TiO, $Ta_2O_5$, $Y_2O_3$, STO, BTO, BaZrO, HfZrO, HfLaO, HfTaO, HfTiO, a combination thereof, or a suitable material. In alternative embodiments, the high-k material can optionally include a silicate such as HfSiO, LaSiO, AlSiO, a combination thereof, or a suitable material. The method of forming the gate dielectric material layer includes performing molecular-beam deposition (MBD), atomic layer deposition (ALD), chemical vapor deposition (CVD), physical vapor deposition (PVD), or the like. In some embodiments, an oxide layer such as a silicon oxide layer may be formed between the high-k material and the substrate 100 through a thermal oxidation process. In some embodiments, the dummy layer includes silicon-containing material such as polysilicon or amorphous silicon. The method of forming the dummy layer includes performing a suitable process such as PVD, CVD or ALD.

Referring to FIG. 1 and FIG. 3A simultaneously, in step S12, a spacer 112 is formed beside the dummy gate structure 102. Specifically, the spacer 112 is formed on a sidewall of the dummy gate structure 102. In some embodiments, a spacer material layer is formed on the substrate 100 covering the dummy gate structure 102, and an anisotropic etching process is performed to remove a portion of the spacer material layer. In some embodiments, the spacer material layer is formed of dielectric materials, such as silicon oxide (SiO), silicon nitride (SiN), silicon oxynitride (SiON), silicon carbide (SiC), silicon carbo-oxynitride (SiCON), fluoride-doped silicate glass (FSG), a low k dielectric material, or a combination thereof. The method of forming the spacer material layer may be formed using a suitable process such as ALD, CVD, or a combination thereof. In some embodiments, the spacer 112 is made of a single material. In alternative embodiments, each of the spacer 112 is a multi-layer structure.

Referring to FIG. 3A, source and drain (S/D) regions 110 are formed in the substrate 100 to provide a low resistance contact. In some embodiments, doped regions are achieved via ion implantation of boron or phosphorous. Alternatively, in some other embodiments, parts of the substrate 100 are removed through etching or other suitable processes and the dopants are formed in the hollowed areas through growth of epitaxy. Specifically, the epitaxial layers include SiGe, SiC, or other suitable materials. It is understood that the semiconductor device may be formed by subjecting CMOS technology processing, and thus some processes are not described in detail herein.

In some embodiments, silicide regions (not shown) may be optionally formed on the source and drain regions 110 by a self-aligned silicide (salicide) process. The silicide region includes titanium silicide, cobalt silicide, nickel silicide, platinum silicide, erbium silicide, or palladium silicide. In some embodiments, germanide regions may be optionally formed on the source and drain regions 110 by a self-aligned germanide process if the substrate 100 includes Ge. In some embodiments, the germanide regions include NiGe, PtGe, $TiGe_2$, $CoGe_2$, or PdGe.

Referring to FIG. 3A, an etch stop layer 114 is formed over the dummy gate structure 102 and the substrate 100. In some embodiments, the etch stop layer 114 is formed to overlay the top surface of the dummy gate structure 102 and sidewalls of the spacer 112. In some embodiments, the etch stop layer 114 is a contact etch stop layer (CESL). The etch stop layer 114 includes silicon nitride or carbon-doped silicon nitride, for example. In some embodiments, the etch stop layer 114 is deposited by performing CVD, HDPCVD, SACVD, molecular layer deposition (MLD), or other suitable processes. In some embodiments, before the etch stop layer 114 is formed, a buffer layer (not shown) may be further formed over the substrate 100. In some embodiments, the buffer layer is an oxide such as silicon oxide. However, other compositions may be possible. In some embodiments, the buffer layer is deposited by performing CVD, HDPCVD, SACVD, MLD, or other suitable processes.

Referring to FIG. 1 and FIG. 3A simultaneously, in step S14, a dielectric layer 116 is formed over the substrate 100 to overlay the etch stop layer 114 and aside the dummy gate structure 102. The dielectric layer 116 includes a dielectric material. The dielectric material includes silicon oxide, silicon nitride, silicon oxynitride, phosphosilicate glass (PSG), borophosphosilicate glass (BPSG), spin-on glass (SOG), undoped silicate glass (USG), fluorinated silica glass (FSG), carbon doped silicon oxide (e.g., SiCOH), polyimide, and/or a combination thereof. In some other embodiments, the dielectric layer 116 includes low-k dielectric materials. It should be noted that the low-k dielectric materials are generally dielectric materials having a dielectric constant lower than 3.9. Examples of low-k dielectric materials includes BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the dielectric layer 116 may include one or more dielectric materials and/or one or more dielectric layers. In some embodiments, the dielectric layer 116 is formed by performing CVD, HDPCVD, SACVD, spin-on, or other suitable processes.

Figure 3B:
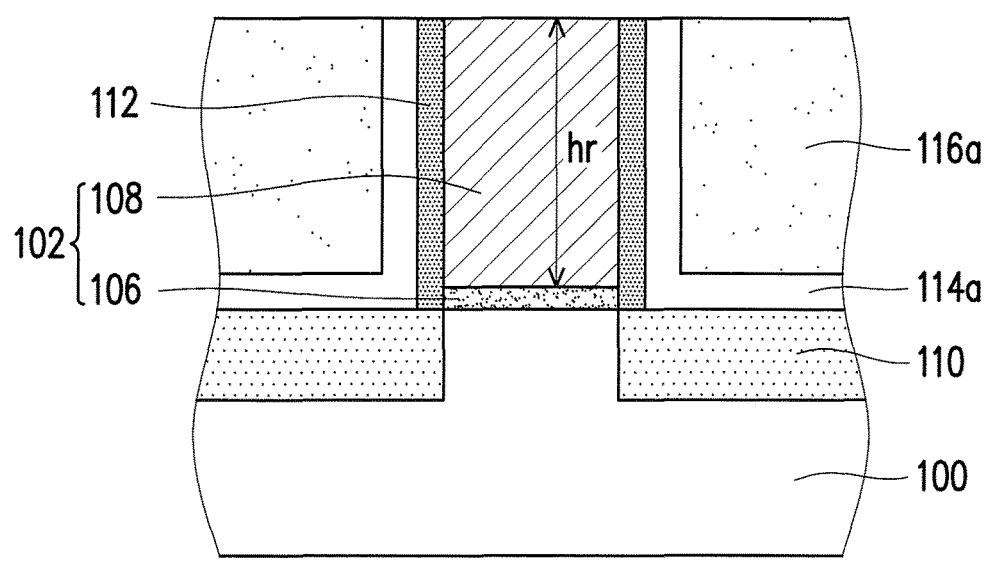

Referring to FIG. 3A and FIG. 3B, a portion of the dielectric layer 116 and a portion of the etch stop layer 114 are removed, such that a top surface of the dummy gate structure 102 is exposed, and a dielectric layer 116a and an etch stop layer 114a are remained. The process of removing the portion of the dielectric layer 116 and the portion of the etch stop layer 114 is achieved by performing a chemical mechanical polishing (CMP) process, an etching process, or other suitable processes.

Referring to FIG. 1 and FIG. 3B to FIG. 3E, at Step S16, a multi-step removing process is performed to remove the dummy gate 108 and a portion of the spacer 112, so as to form a gate trench 122 and a spacer 112c. The gate trench 122 is a wide middle trench. In some embodiments, the multi-step removing process may be implemented as follows.

Figure 2:
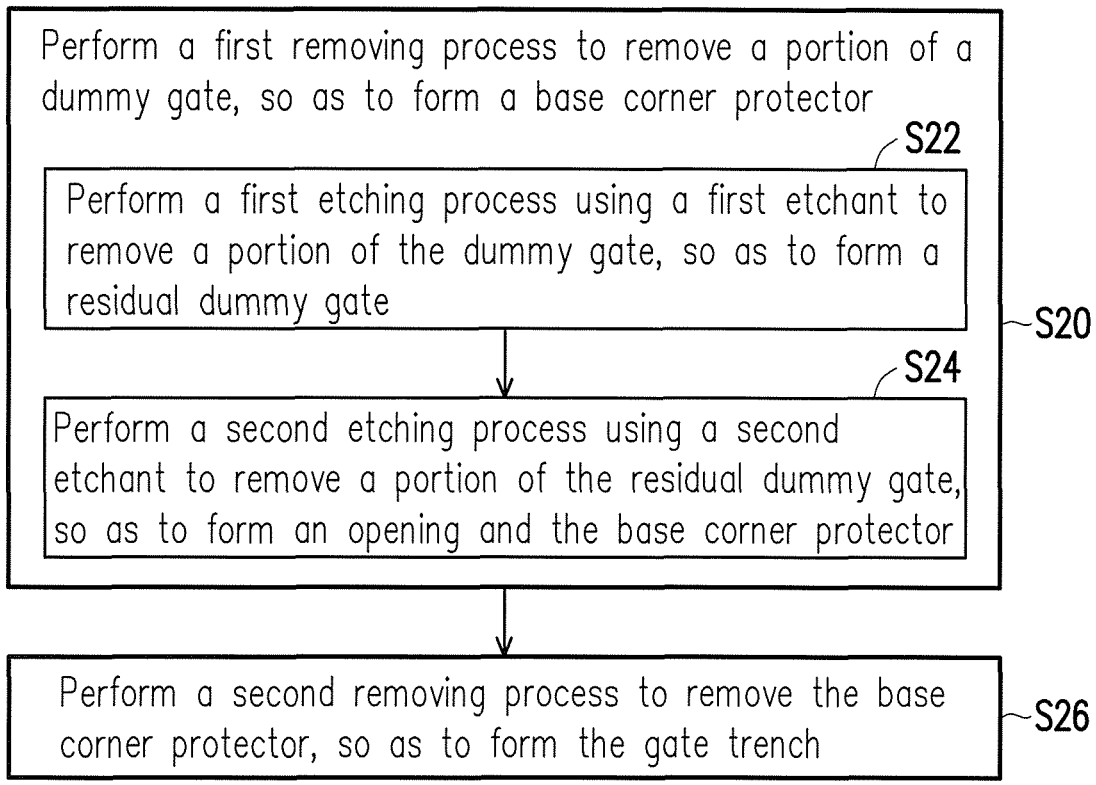
FIG. 2 is a flowchart illustrating a removing process for forming a gate trench according to some embodiments of the disclosure.
Figure 3C:
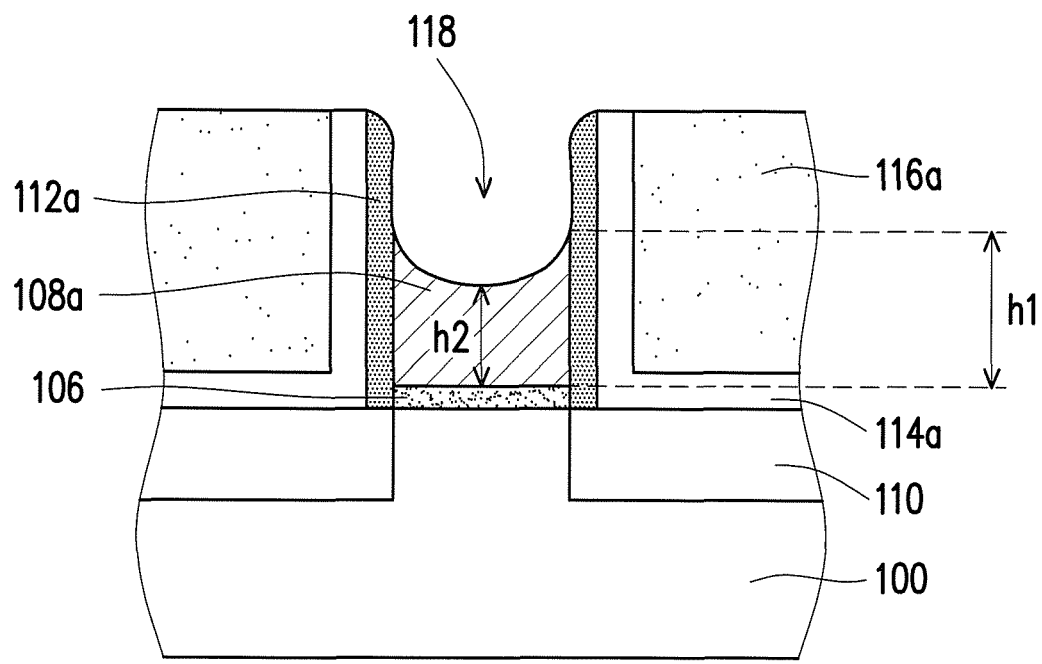
Figure 3D:
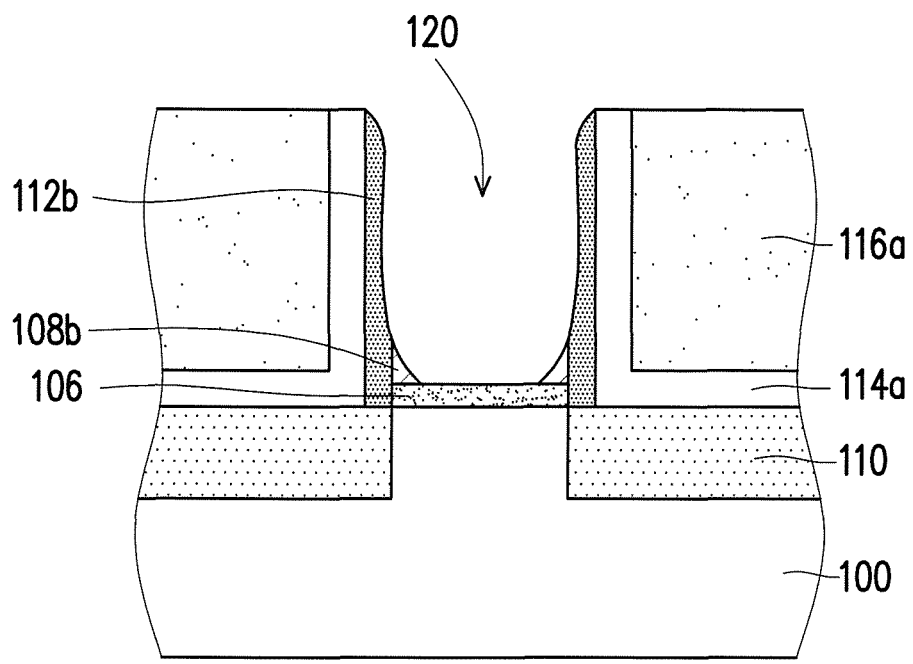
Figure 3E:
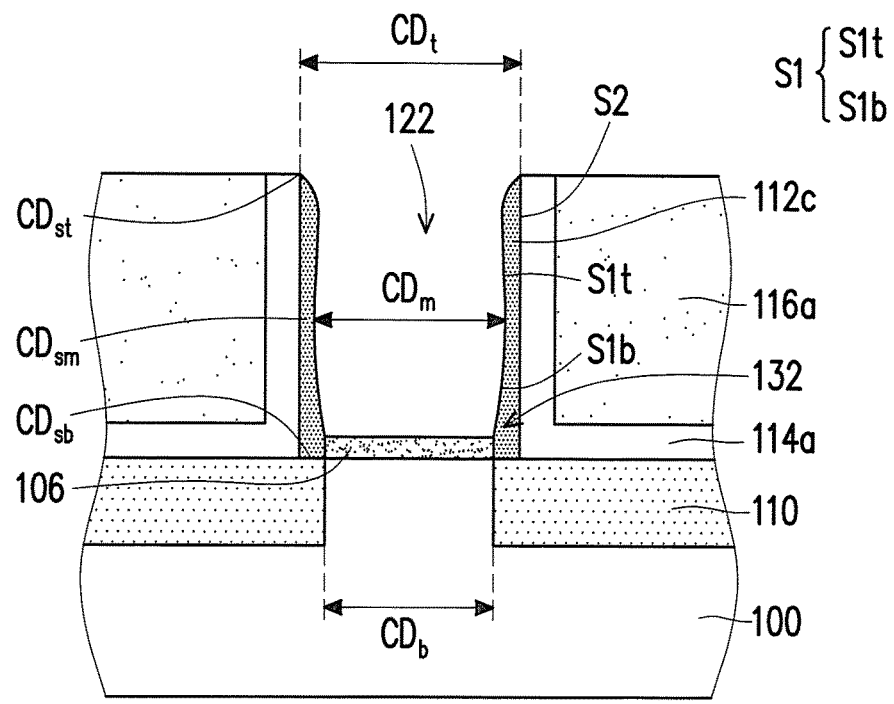

Referring to FIG. 2, FIG. 3C, and FIG. 3E, at Step S20, a first removing process is performed to remove a portion of the dummy gate 108, so as to form a base corner protector 108b. The first removing process (Step S20) may include a first etching process (Step S22) and a second etching process (Step S24). Then, referring to FIG. 3E, a second removing process is performed to remove the base corner protector 108b, so as to form the gate trench 122. Before performing the first etching process, a pre-removal process may be performed to break through a native oxide layer formed on the dummy gate 108. Details of the first removing process and the second removing process are described in the following.

Referring to FIG. 2, FIG. 3B, and FIG. 3C, in some embodiments, the first removing process (Step S20) may include the first etching process (Step S22) and the second etching process (Step S24). At Step S22, the first etching process is performed to remove a portion of the dummy gate 108 by using a first etchant, so as to form an opening 118 and residual dummy gate 108a. In some embodiments, the first etching process is also referred to as a main etching process, and the first etching process may be an anisotropic etching process such as a dry etching process. The first etchant has a high etching selectivity ratio between the dummy gate 108a and the spacer 112. The first etchant has an etching selectivity ratio of the dummy gate 108a to the spacer 112 of 700 to 4, for example. In some embodiment, the first etchant that is polymer-rich is used in the first etching process. By using the by-product rich first etchant, more by-products (such as polymer) may be generated when etching the dummy gate 108. The by-products cover a sidewall of the spacer 112 to protect the spacer 112 and reduce a loss of width of the spacer 112 due to lateral etching. In some exemplary embodiments, the first etching process is a plasma etching process, and the first etchant includes HBr, $O_2$, and $N_2$. After performing the first etching process, a sidewall of the opening 118 exposes the spacer 112a. Also, at a bottom of the opening 118, the residual dummy gate 108a is exposed. A top surface of the residual dummy gate 108a exposed at the bottom of the opening 118 is a curved surface or a bent surface (e.g. a V shape), for example. In other words, a height h1 of the residual dummy gate 108a closer to the spacer 112a is greater than a height h2 of the residual dummy gate 108a away from the spacer 112a. The height h1 is the maximum height of the residual dummy gate 108a, and the height h2 is the minimum height of the residual dummy gate 108a. In an example, the height h1 of the residual dummy gate 108a is in a range from ⅖ to ⅗ of a height ht of the dummy gate 108.

Referring to FIG. 2, FIG. 3C, and FIG. 3D, at Step S24, the second etching process is performed by using a second etchant to remove a portion of the residual dummy gate 108a, so as to form the base corner protector 108b and an opening 120. In some embodiments, the second etching process is also referred to as an over-etch process. In other words, the second etchant has a low etching selectivity ratio between the residual dummy gate 108a and the spacer 112a. The second etchant has an etching selectivity ratio of the residual dummy gate 108a to the spacer 112a of 300 to 10, for example. In other words, the first etchant used in the first etching process has a higher etching selectivity ratio between the dummy gate 108 and the spacer 112, while the second etchant used in the second etching process has a lower etching selectivity ratio between the residual dummy gate 108a and the spacer 112a. In some embodiments, by-products generated by the second etchant in the second etching process are fewer than the by-products generated by the first etchant in the first etching process. Thus, compared with the second etching process, the first etching process exhibits more significant vertical etching, and compared with the first etching process, the second etching process exhibits more significant lateral etching. In some embodiments, the second etching process is an anisotropic etching process such as a dry etching process. The second etching process is a plasma etching process, for example. In some exemplary embodiment, the second etchant includes $Cl_2$ and $NF_3$. In some embodiments, the gate dielectric layer 106 may serve as an etch stop layer in the second etching process. Thus, after performing the second etching process, a sidewall of the opening 120 exposes the spacer 112b, and the base corner protector 108b and the gate dielectric layer 106 are exposed at a bottom of the opening 120. In some embodiments, the base corner protector 108b includes two parts, and is located at base corners of the opening 120. In addition, the base corner protector 108b covers a portion of a surface of the gate dielectric layer 106 and a sidewall of the spacer 112b. In some embodiments, a portion of the base corner protector 108b is in a shape of a triangle or in a shape similar to a triangle. In some exemplary embodiments, a height hr of the dummy gate 108 is in a range from 350 angstroms to 900 angstroms, and at least a part of the base corner protector 108b is a triangle with a base in a range from 6 nm to 10 nm and a height in a range from 6 nm to 10 nm. After performing the second etching process, a critical dimension of the spacer 112b that is not covered by the base corner protector 108b is smaller than a critical dimension of the spacer 112a (FIG. 3C) before the second etching process is performed, and a critical dimension of the spacer 112b that is covered by the base corner protector 108b is approximately equal to a critical dimension of the spacer 112 (FIG. 3B) before the first etching process is performed.

Referring to FIG. 2, FIG. 3D, and FIG. 3E, at Step S24, the second removing process is performed to remove the base corner protector 108b, so as to form the gate trench 122. The second removing process is an anisotropic etching process such as a wet etching process, for example. In some embodiments, an etchant of the second removing process includes hydrofluoric acid and ammonium hydroxide solutions.

After performing the first removing process and the second removing process, the gate trench 122 has a wide middle profile. More specifically, a top critical dimension (CDt1) of the gate trench 122 may be equal to, smaller than, or greater than a middle critical dimension (CDm) of the gate trench 122, and the middle critical dimension (CDm) of the gate trench 122 is greater than a bottom critical dimension (CDb) of the gate trench 122. A sidewall of the gate trench 122 exposes a first side surface S1 of the spacer 112c, and a bottom of the gate trench 122 exposes the gate dielectric layer 106. In the first side surface S1 of the spacer 112c, at least a portion of an upper surface S1t from a middle of the spacer 112c to a top of the spacer 112c may include a curved surface or an inclined surface, and at least a portion of a lower surface S1b from the middle of the spacer 112c to the bottom of the spacer 112c may include a curved surface or an inclined surface. A second side surface S2 of the spacer 112c may be a vertical surface, an inclined surface, or a curved surface.

Figure 3F:
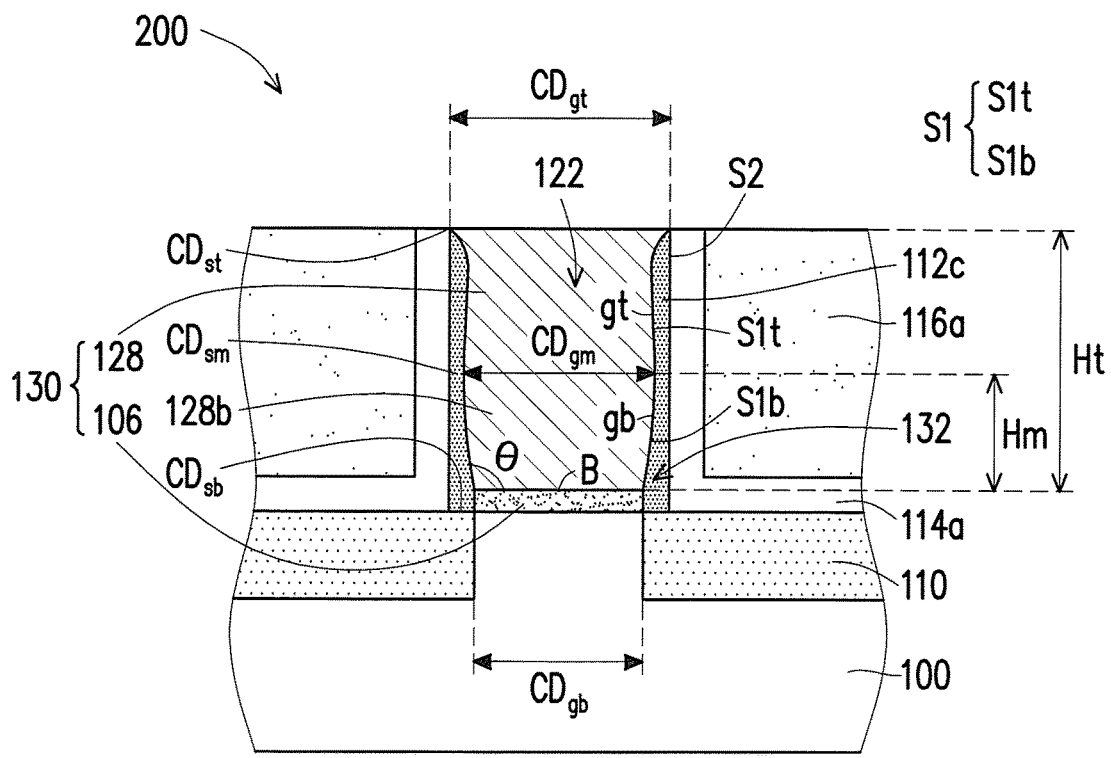

Then, referring to FIG. 1, FIG. 3E, and FIG. 3F, the gate electrode 128 is formed in the gate trench 122. The gate electrode 128 may include a barrier, a work function layer, a seed layer, an adhesion layer, a barrier layer, or a combination thereof. In some embodiments, the gate electrode 128 includes suitable metals, such as TiN, WN, TaN, or Ru for a PMOS device. In some alternative embodiments, the gate electrode 128 includes suitable metals, such as Ti, Ag, Al, TiAl, TiAlN, TaC, TaCN, TaSiN, Mn, or Zr for an NMOS device. The gate electrode 128 may be formed by a gate replacement process. The gate replacement process has been well known to people skilled in the art, and the details are not iterated herein.

In alternative embodiments, before the gate electrode 128 is formed, the gate dielectric layer 106 is removed and another gate dielectric layer is formed. Materials of the another gate dielectric layer and the gate dielectric layer 106 may be different. In some embodiments, the gate dielectric layer 106 may be formed of silicon oxide or silicon nitride, and the another gate dielectric layer may be formed of a high-k material. In some embodiments, the high-k material includes metal oxide such as HfO, LaO, AlO, ZrO, TiO, $Ta_2O_5$, $Y_2O_3$, STO, BTO, BaZrO, HfZrO, HfLaO, HfTaO, HfTiO, a combination thereof, or a suitable material. In alternative embodiments, the high-k material can optionally include a silicate such as HfSiO, LaSiO, AlSiO, a combination thereof, or a suitable material. Besides, before forming the another gate dielectric layer, an interfacial layer (IL) may be formed. The interfacial layer may be formed of silicon oxide or silicon nitride, for example, and the interfacial layer may be formed by performing a thermal oxidation process.

The semiconductor device of the disclosure is described with reference to FIG. 3F in the following. In some embodiments, the semiconductor device of the disclosure is a FinFET device. In alternative embodiments, the semiconductor device of the disclosure is a planar MOS device.

Referring to FIG. 3F, a semiconductor device 200 includes a gate structure 130, source and drain regions 110, and a spacer 112c. The gate structure 130 is located over the substrate 100. The source and drain regions 110 are located in the substrate 100 at sides of the gate structure 130. The spacer 112c is located at a sidewall of the gate structure 130. The source and drain regions 110 are described as above. Thus, details in this respect will not be repeated in the following.

The gate structure 130 includes the gate dielectric layer 106 and the gate electrode 128. The gate dielectric layer 106 is located between the gate electrode 128 and the substrate 100. The material of the gate dielectric layer 106 is described as above. Thus, details in this respect will not be repeated in the following.

In some embodiments, the substrate 100 is a substrate with at least one fin extending in a first direction, and the gate structure 130 is formed across the at least one fin and extends in a second direction different from the first direction. In alternative embodiments, the substrate 100 is a planar substrate or a bulk substrate, and the gate structure 130 is formed over the planar substrate or the bulk substrate.

The gate electrode 128 has a wide middle profile. In some embodiments, a bottom critical dimension CDgb of the gate electrode 128 is smaller than a middle critical dimension CDgm of the gate electrode 128, and a top critical dimension CDgt of the gate electrode 128 may be smaller than, equal to, or greater than the middle critical dimension CDgm. A height Hm of the middle critical dimension CDgm of the gate electrode 128 is within a range from ⅖ to ⅗ of a height Ht of the gate electrode 128.

At least a portion of a sidewall of the gate electrode 128 is a curved surface or an inclined surface. More specifically, at least a portion of a lower sidewall gb of the gate electrode 128 is a curved surface or an inclined surface. At least a portion of an upper sidewall gt of the gate electrode 128 may also be a curved surface or an inclined surface. An angle θ of a base corner of the gate electrode 128 is greater than 90 degrees. Here, the angle θ of the base corner refers to an angle between the lower sidewall gb of the gate electrode 128 and a bottom surface B of the gate electrode 128. In some exemplary embodiment, the angle θ of the base corner is in a range from 95 degrees to 120 degrees. In other words, an undercut 132 is provided between a lower sidewall of the gate structure 130 and a surface of the substrate 100. In some embodiments, a cross-section of the gate electrode 128 is in a shape of a bowling pin, a rugby ball, or an upside down bell. In some other embodiments, a cross-section of a combination of a lower part 128b of the gate electrode 128 and the gate dielectric layer 106 is bowl-shaped.

The spacer 112c is located at the sidewall of the gate structure 130. At least a portion of the spacer 112c is filled into the undercut 132. A top critical dimension CDst of the spacer 112c is smaller than a middle critical dimension CDsm of the spacer 112d, and a bottom critical dimension CDsb of the spacer 112c is greater than the middle critical dimension CDsm. In other words, a location of the middle critical dimension of the spacer 112c is a neck region of the spacer 112c. A height of the middle critical dimension CDsm of the spacer 112c, which is the same as the height Hm, is within a range from ⅖ to ⅗ of a height Ht of the gate electrode 128. In some embodiments, a gradual increase is shown from the middle critical dimension CDsm of the spacer 112c to the bottom critical dimension CDsb of the spacer 112c. In some exemplary embodiments, the height Ht of the gate electrode 128 is in a range from 350 angstroms to 900 angstroms, the height Hm of the gate electrode 128 with the middle critical dimension CDgm is in a range from 140 angstroms to 600 angstroms, the middle critical dimension CDsm of the spacer 112c is in a range from 10 angstroms to 80 angstroms, and the bottom critical dimension CDsb is in a range from 10 angstroms to 100 angstroms. At least a portion of a sidewall of the spacer 112c is a curved surface or an inclined surface. More specifically, at least a portion of the lower surface S1b of the spacer 112c is a curved surface or an inclined surface. At least a portion of the upper surface S1t of the spacer 112c is a curved surface or an inclined surface.

In the disclosure, the distance from the gate structure to the contact plug is increased because the spacer is provided with a wider bottom and the gate structure is provided with a narrow bottom. Therefore, the conventional leakage current caused by the short distance between the gate structure and the contact plug is not observed. Specifically, the gate dielectric layer and the gate electrode may be prevented from being damaged during the step of etching the contact hole. Thus, a time-dependent dielectric breakdown (TDDB) window of an IO transistor is increased and the device reliability is improved.

In accordance with some embodiments of the present disclosure, a semiconductor includes a gate electrode, source and drain regions, and a spacer. The gate electrode is located over a substrate, and an angle of a base corner of the gate electrode is greater than 90 degrees. The source and drain regions are located in the substrate at sides of the gate electrode. The spacer is located at a sidewall of the gate electrode.

In accordance with alternative embodiments of the present disclosure, a semiconductor device includes a gate structure, source and drain regions, and a spacer. The gate structure is located over a substrate and includes a wide middle gate electrode. The source and drain regions are located in the substrate at sides of the gate structure. The spacer is located at a sidewall of the gate structure.

In accordance with alternative embodiments of the present disclosure, a method for manufacturing a semiconductor device includes steps as follows. A dummy gate is formed over a substrate. A spacer is formed on a sidewall of the dummy gate. A dielectric layer is formed on the substrate, and the dielectric layer is located beside the spacer. A multi-step removing process is performed to remove the dummy gate and a portion of the spacer, so as to form a gate trench. The gate trench is a wide middle trench. A wide middle gate electrode is formed in the gate trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a gate electrode, located over a substrate, wherein an angle of a base corner of the gate electrode is greater than 90 degrees;
 source and drain regions, located in the substrate at sides of the gate electrode; and
 a spacer, located at a sidewall of the gate electrode,
 wherein an outer sidewall of the spacer is a vertical surface and is opposite to the sidewall of the gate electrode, and a bottom critical dimension of the spacer is greater than a middle critical dimension of the spacer.

2. The semiconductor device as claimed in claim 1, wherein a bottom critical dimension of the gate electrode is smaller than a middle critical dimension of the gate electrode.

3. The semiconductor device as claimed in claim 2, wherein at least a portion of a lower sidewall of the gate electrode comprises a curved surface or an inclined surface.

4. The semiconductor device as claimed in claim 2, wherein a cross section of a portion of the gate electrode is in a shape of a bowling pin, a rugby ball, or an upside down bell shape.

5. The semiconductor device as claimed in claim 1, wherein there is an increase from the middle critical dimension of the spacer to the bottom critical dimension of the spacer.

6. The semiconductor device as claimed in claim 1, wherein the angle of the base corner is in a range from 95 degrees to 120 degrees.

7. A semiconductor device, comprising:
- a gate structure, located over a substrate, wherein the gate structure comprises a wide middle gate electrode;
- source and drain regions, located in the substrate at sides of the gate structure; and
- a spacer, located at a sidewall of the gate structure, wherein the spacer has a neck region between a top and a bottom of the spacer.

8. The semiconductor device as claimed in claim 7, wherein a location of a middle critical dimension of the wide-middle gate electrode is within a range from $2/5$ to $3/5$ of a height of the wide-middle gate electrode.

9. The semiconductor device as claimed in claim 7, wherein an undercut is provided between the sidewall of the gate structure and a surface of the substrate, and at least a portion of the spacer is filled into the undercut.

10. The semiconductor device as claimed in claim 7, wherein a bottom critical dimension of the spacer is greater than a middle critical dimension of the spacer.

11. The semiconductor device as claimed in claim 7, wherein there is an increase from a middle critical dimension of the spacer to a bottom critical dimension of the spacer.

12. The semiconductor device as claimed in claim 11, wherein at least a portion of a side surface from the spacer with the middle critical dimension to the spacer with the bottom critical dimension is a curved surface or an inclined surface.

13. A semiconductor device, comprising:
- a gate structure, located over a substrate, wherein the gate structure comprises a wide middle gate electrode;
- source and drain regions, located in the substrate at sides of the gate structure; and
- a spacer, located at a sidewall of the gate structure, wherein at least a portion of a side surface of the wide middle gate electrode is a curved surface.

14. The semiconductor device as claimed in claim 13, wherein a location of a middle critical dimension of the wide middle gate electrode is within a range from $2/5$ to $3/5$ of a height of the wide-middle gate electrode.

15. The semiconductor device as claimed in claim 13, wherein an undercut is provided between the sidewall of the gate structure and a surface of the substrate, and at least a portion of the spacer is filled into the undercut.

16. The semiconductor device as claimed in claim 13, wherein a bottom critical dimension of the spacer is greater than a middle critical dimension of the spacer.

17. The semiconductor device as claimed in claim 13, wherein there is an increase from a middle critical dimension of the spacer to a bottom critical dimension of the spacer.

18. The semiconductor device as claimed in claim 13, wherein an angle of a base corner of the wide middle gate electrode is greater than 90 degrees.

19. The semiconductor device as claimed in claim 18, wherein the angle of the base corner is in a range from 95 degrees to 120 degrees.

* * * * *